(12) United States Patent
Choi et al.

(10) Patent No.: US 8,188,836 B2
(45) Date of Patent: May 29, 2012

(54) APPARATUS FOR SWITCHING HIGH FREQUENCY SIGNALS

(75) Inventors: Jung-han Choi, Yongin-si (KR); In-sang Song, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1507 days.

(21) Appl. No.: 11/705,492

(22) Filed: Feb. 13, 2007

(65) Prior Publication Data

US 2008/0024194 A1    Jan. 31, 2008

(30) Foreign Application Priority Data

Jul. 28, 2006    (KR) .................. 10-2006-0071712

(51) Int. Cl.
*G06F 11/20* (2006.01)
*H03K 17/00* (2006.01)

(52) U.S. Cl. ........... 340/2.8; 455/92; 455/108; 307/112; 342/435; 375/295; 375/312

(58) Field of Classification Search .................. 340/2.8
See application file for complete search history.

(56) References Cited

U.S. PATENT DOCUMENTS

| | | | | |
|---|---|---|---|---|
| 3,202,941 A * | 8/1965 | Giger | ............................ | 333/103 |
| 3,217,223 A * | 11/1965 | Chubb, Jr. | ..................... | 318/432 |
| 6,476,442 B1 * | 11/2002 | Williams et al. | .............. | 257/328 |
| 6,542,021 B2 * | 4/2003 | Isono et al. | ................... | 327/365 |
| 6,972,637 B2 * | 12/2005 | Nation | ........................... | 333/104 |
| 7,787,831 B2 * | 8/2010 | Uejima et al. | .................. | 455/78 |
| 2007/0178849 A1 * | 8/2007 | St. Germain et al. | ........... | 455/83 |

* cited by examiner

*Primary Examiner* — George Bugg
*Assistant Examiner* — Anthony D Afrifa-Kyei
(74) *Attorney, Agent, or Firm* — Sughrue Mion, PLLC

(57) ABSTRACT

A high frequency signal switching apparatus includes a bias unit which transmits a bias power source; a control signal transmitter, which provides a control signal received from outside; and a switching unit, so that the input signal input through the input terminal by switching one or more diodes according to the control signal driven by the bias power source is output selectively on the output terminal.

15 Claims, 4 Drawing Sheets

APPARATUS FOR SWITCHING HIGH FREQUENCY SIGNALS

CROSS-REFERENCE TO RELATED APPLICATIONS

This application claims priority from Korean Patent Application No. 10-2006-0071712 filed on Jul. 28, 2006, in the Korean Intellectual Property Office, the disclosure of which is incorporated herein by reference.

BACKGROUND OF THE INVENTION

1. Field of the Invention

The present invention relates to a switching apparatus, and more specifically to a switching apparatus for harmonious switching of high frequency signals.

2. Description of the Related Art

High frequency signals are used in many kinds of electrical apparatus, including communication apparatus. In particular, high frequency signals are used in radar systems for measuring distance.

Field Effect Transistors (FET) are representative of switching components which switch such high frequency signals. However, FETs are effective at switching low frequency signals (under 10 GHz), due to factors such as low insertion loss, but are not as effective at switching high frequency signals (over 10 GHz), due to factors such as nonlinearity and harmonic distortion.

Moreover, FETs are relatively large, and have a complex manufacturing process.

SUMMARY OF THE INVENTION

Exemplary embodiments of the present invention overcome the above disadvantages and other disadvantages not described above. Also, the present invention is not required to overcome the disadvantages described above, and an exemplary embodiment of the present invention may not overcome any of the problems described above.

The present invention provides a switching apparatus which has a high switching capacity at high frequency signals, which is relatively simple to manufacture, and which is smaller than related art switching apparatus.

A switching apparatus of the present invention comprises a bias unit, which provides a bias power source; a control signal transmitter, which transmits a control signal in order to control the switching received from outside; and a switching unit which is driven by the bias power source received from the bias unit, and switches one or more diodes according to the control signal received from the control signal transmission unit, in order that the input signal is selectively output.

Additionally, it is desirable that the input signal is output if the diodes of the switching unit are turned off by the control signal, and that the input signal is not output if one or more diodes are turned on by the control signal.

The switching unit may comprise a first diode and a second diode connected in parallel, and if the first diode and the second diode are turned on by the control signal, a part of the input signal of the first diode is not output, and the remainder of the input signal of the second diode is not output.

Also, the switching unit may further comprise a high impedance line disposed between the input of the switching unit and the output of the switching unit, and in which the anodes of the one or more diodes are connected, and which has an impedance of more than a specified value.

The switching unit may further comprise a first diode connected to the anode at one end of the high impedance line, and a second anode connected to the anode at the other end of the high impedance line.

The one or more diodes may comprise a plurality of diodes connected in series.

Also, the one or more diodes may be formed as Schottky diodes.

The switching apparatus may further comprise an input signal transmission unit, which implements impedance matching between the component generating the input signal and the input terminal of the switching unit, and a matching unit, which implements impedance matching between the output terminal of the switching unit and the output terminal of the switching apparatus.

Also, the input signal transmission unit may comprise a quarter wavelength transformer, and the matching unit may comprise a quarter wavelength transformer.

The switching apparatus may further comprise a first coupling unit, which blocks the input of the bias power source to the input signal transmission unit; and a second coupling part, which blocks the input of the bias power source to the matching unit.

In the control signal transmission unit, the input signal received from the switching unit may be able to block the control signal so that the generated signal is not transmitted.

The control signal transmission unit may further comprise a radial stub in order to block the control signal.

Also, the bias unit is able to block the input of the input signal from the switching unit.

The bias unit may further comprise a radial stub in order to block the input of the input signal.

The input signal may be a high frequency signal.

DESCRIPTION OF THE EXEMPLARY EMBODIMENTS

The exemplary embodiments of the present invention are explained in greater detail below referring to the attached drawings.

Figure 1:
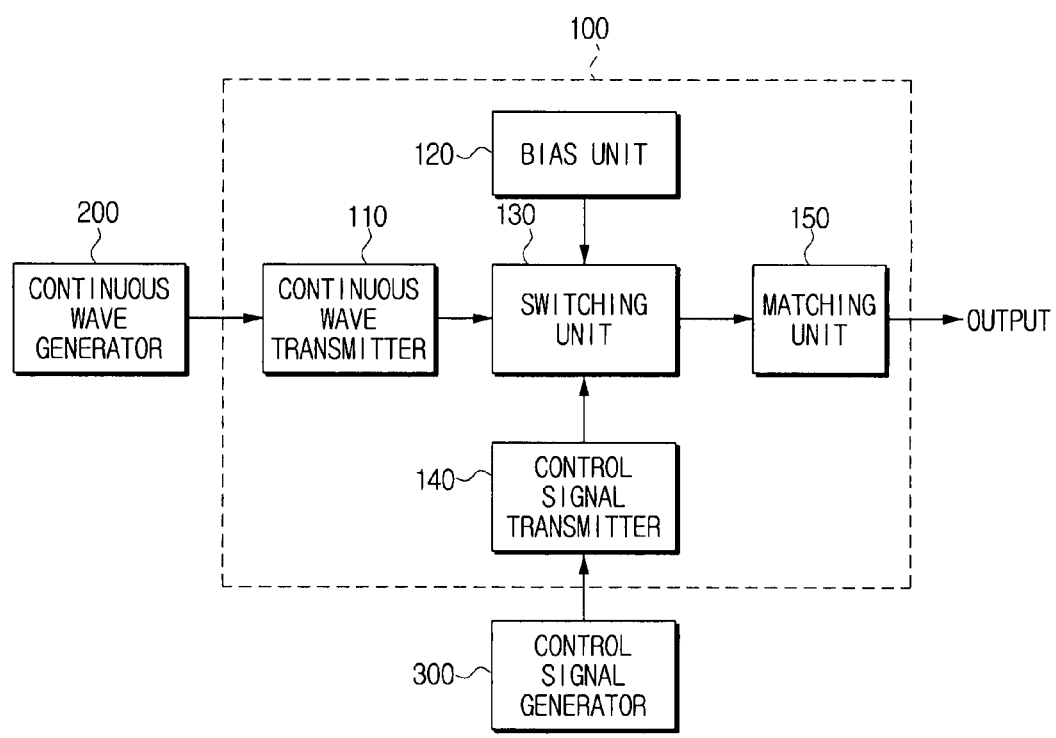
FIG. 1 is a block diagram illustrating a high frequency signal switching apparatus according to an exemplary embodiment of the present invention.

FIG. 1 is a block diagram illustrating a switching apparatus according to an exemplary embodiment of the present invention. The switching apparatus 100 is able to smoothly perform switching even at high frequencies.

The switching apparatus 100 illustrated in FIG. 1 is connected to a continuous wave generator 200 and a control signal generator 300. A continuous wave signal received from the continuous wave generator 200 may be output or not output by the switching apparatus 100, under control of a control signal transmitted by the control signal generator 300. The control signal generated by the control signal generator 300 may include high frequency signals, or direct current or low frequency signals.

The switching apparatus 100 which implements the aforementioned functions comprises a continuous wave transmitter 110, a bias unit 120, a switching unit 130, a control signal transmitter 140, and a matching unit 150. Also, although not shown in FIG. 1, the switching apparatus 100 may also comprise coupling components.

The continuous wave transmitter 110 implements impedance matching between the continuous wave generator 200 and the switching unit 130. Impedance matching by the continuous wave transmitter 110 prevents the continuous wave signal input into the switching unit 130 from being distorted due to the high level of impedance of the line disposed on the interior of the switching unit 130. The continuous wave transmitter 110 may be formed as a quarter wavelength transformer.

The bias unit 120 transmits the bias power source to the switching unit 130. The bias unit 120 also blocks the input into itself of the continuous wave signal input into the switching unit 130.

The switching unit 130 is driven by the bias power source generated by the bias unit 130, and the continuous wave input signal may be output or not output from the switching apparatus 100, according to whether it is switched on or off by the control signal output from the control signal generator 300. The switching action uses the diodes, so that it is possible to use just one diode, and it is also possible to use two or more diodes.

Moreover, the input terminal of the switching unit 130 connected to the continuous wave transmitter 110 and the output terminal of the switching unit 130 connected to the matching unit 150 are connected via a high impedance line. The high impedance line used here is a line with an impedance higher than 50 Ω.

The control signal transmitter 140 transmits a control signal generated by the control signal generator 300 to the switching unit 130. Moreover, the control signal transmitter 140 blocks continuous waves input into the switching unit 130 from being input into the control signal generator 300.

The matching unit 150 implements impedance matching between the output terminal of the switching part 130 and the output terminal of the switching apparatus 100. Impedance matching by the matching unit 150 prevents distortion of the continuous wave output from the switching unit 130, due to the high impedance of the line provided on the interior of the switching unit 130. The matching unit 150 may be embodied as a quarter wavelength transformer.

Figure 2:
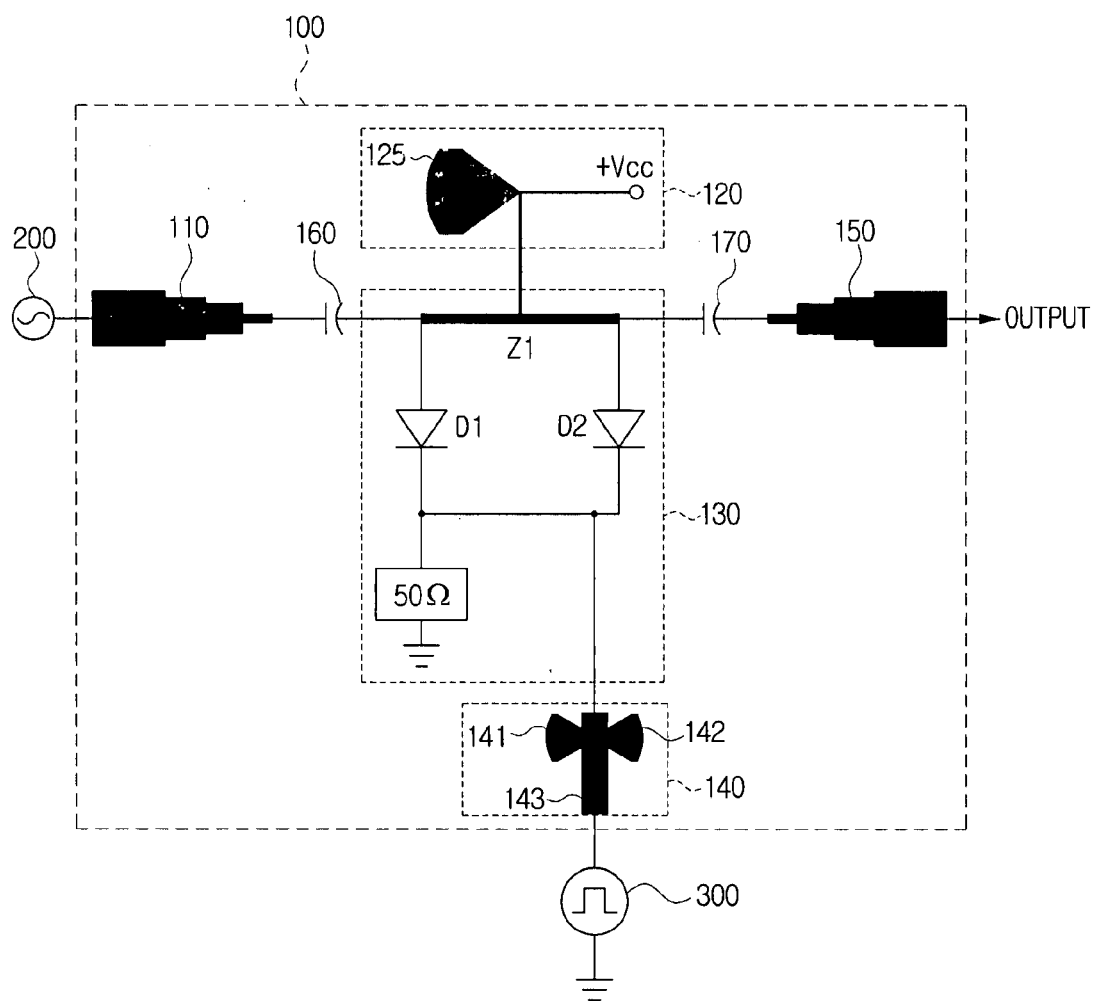
FIG. 2 is a detailed circuit diagram of the switching apparatus illustrated in FIG. 1.

FIG. 2 is a detailed circuit diagram of the switching apparatus illustrated in FIG. 1. FIG. 2 further shows two capacitors 160, 170, in addition to the components illustrated in FIG. 1.

The continuous wave transmitter 110 shown in FIG. 2 implements impedance matching between the input terminal of the switching unit 130 and the continuous wave generator 200, gradually increasing the impedance from the continuous wave generator 200 in the direction of the input terminal of the switching part 130.

The bias unit 120 outputs the bias power source (+Vcc) to the switching unit 130, and may comprise a radial stub 125 in order to block the input of the continuous wave from the switching unit 130.

The switching unit 130 comprises a high impedance line Z1, a first diode D1, a second diode D2, and an impedance of 50Ω. Here, the first diode D1 and the second diode D2 may be formed as Schottky diodes.

The high impedance line Z1 is disposed between the input terminal and the output terminal of the switching part 130.

The anode of the first diode D1 and the anode of the second diode D2 are connected in parallel to the high impedance line Z1, and receive the bias power source (+Vcc). Also, the cathode of the first diode D1 and the cathode of the second diode D2 are connected to the impedance (50Ω) and the control signal transmitter 140.

The first diode D1 and the second diode D2 are turned on or off by the control signal received from the control signal generator 300 through the control signal transmitter 140. If the control signal has a logical label 'high', the voltage of the cathodes of the first and second diodes D1, D2 is high, and the first and second diodes D1, D2 are turned off by the bias in the opposite direction.

If the logical label of the control signal is 'low', the voltage of the cathodes of the first and second diodes D1, D2 is low, and the first and second diodes D1, D2 are turned on by the bias in the same direction.

The control signal transmitter 140 comprises a first radial stub 141, a second radial stub 142, and a transmission line 143.

The transmission line 143 transmits the control signal generated by the control signal generator 300 to the cathodes of the first and second diodes D1, D2. Moreover, the first and second radial stubs 141, 142 implement a blocking function so that the continuous wave which passes through the first and second diode D1, D2 is not transmitted to the control signal generator 300.

The matching unit 150 is an element which gradually reduces the impedance in the direction of the output terminal of the switching apparatus 110 from the output terminal of the switching part 130, and implements impedance matching between the output terminal of the switching part 130 and the output terminal of the switching apparatus 110.

The first capacitor 160 is a coupling element which blocks the input of the bias power source (+Vcc) of the bias unit 120 into the continuous wave transmitter 110. Likewise, the second capacitor 170 is a coupling element which blocks the input of the bias power source (+Vcc) of the bias unit 120 into the matching unit 150.

Figure 3:
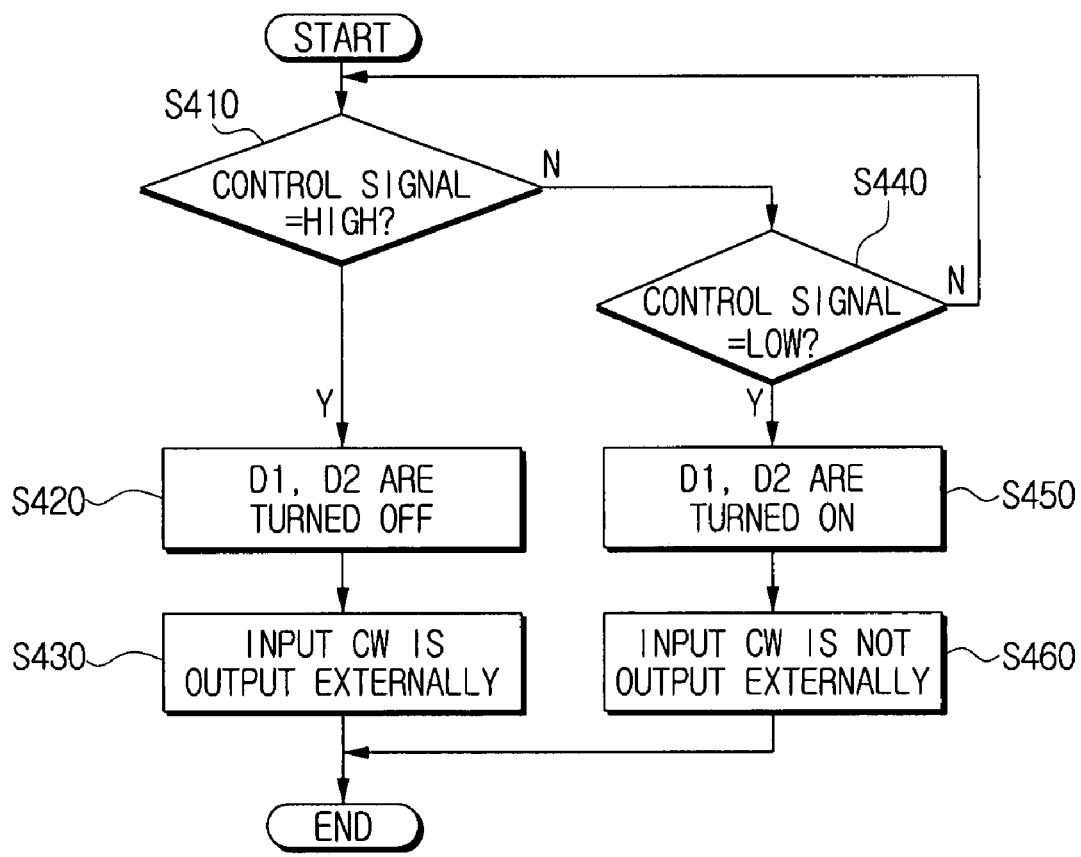
FIG. 3 is a flow diagram of the switching action of the switching apparatus illustrated in FIG. 2.
Figure 4:
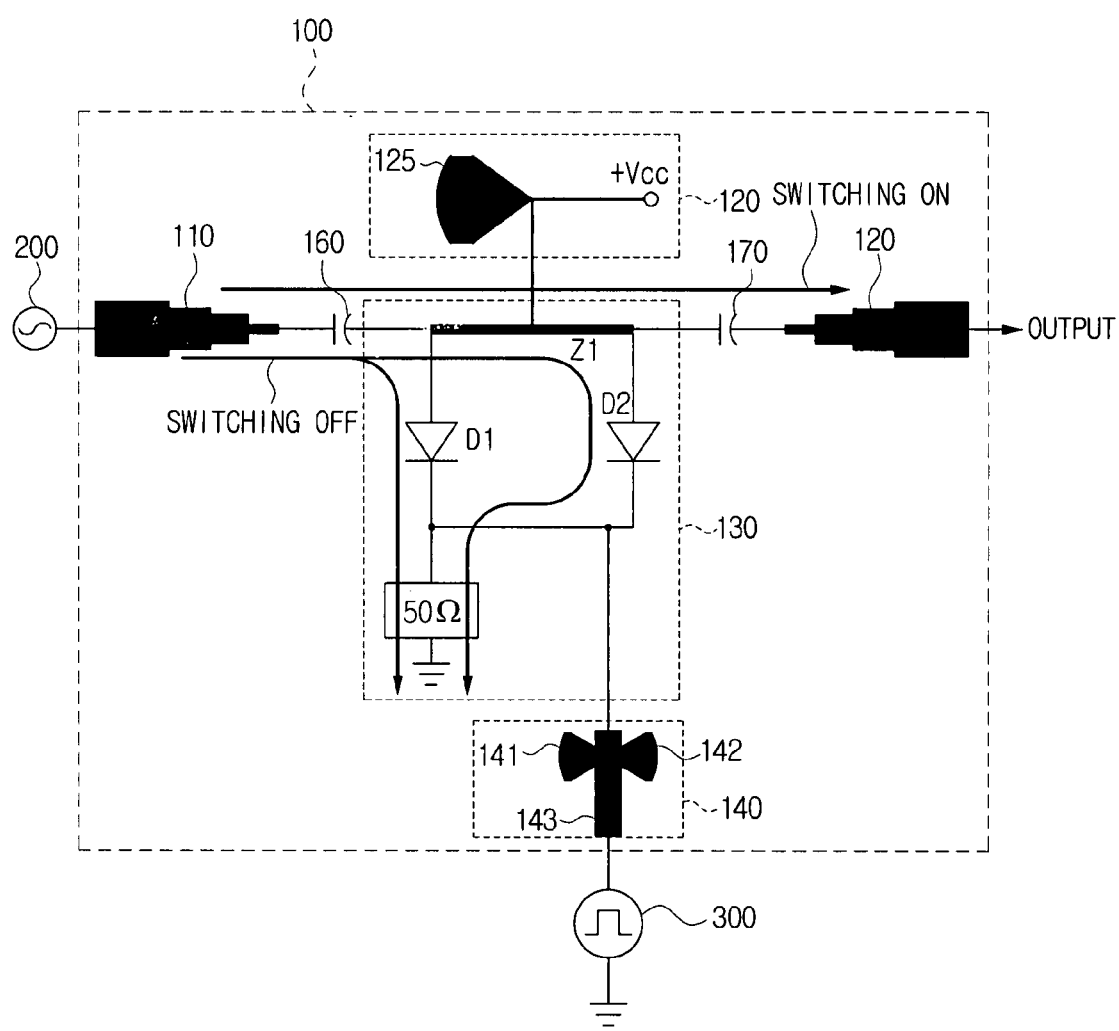
FIG. 4 is a circuit diagram illustrating the flow of the continuous wave according to the switching action.

The switching action of the switching apparatus 100 illustrated in FIG. 2 is explained in detail below, referring to FIGS. 3 and 4. FIG. 3 is a flow diagram of the switching action, and FIG. 4 is a circuit diagram illustrating the flow of the continuous wave signal according to the switching action.

First, the 'switched on' situation, in which the continuous wave signal is input into the switching apparatus 100 and subsequently output, is explained. The 'switched on' situation is a situation in which the control signal output from the control signal generator 300 has a logical level 'high'.

If the control signal output from the control signal generator 300 has a high logical level S410, the first diode D1 and the second diode D2 are turned off S420. This is because the high logical level control signal is transmitted to the cathode of the first diode D1 and the cathode of the second diode D2 through the transmission line 143, so the diodes D1, D2 are biased in the opposite direction.

Accordingly, the continuous wave signal input from the continuous wave generator 200 is output through the continuous wave transmitter 110, the first capacitor 160, the high impedance line Z1, the second capacitor 170, and the matching part 150 S430. Likewise, the reason that the continuous wave is output externally is because the first diode D1 and the second diode D21 are turned off, so the continuous wave signal from the continuous wave generator 200 is not input to the first diode D1 and the second diode D2. The flow of the continuous wave signal when switched on is shown in FIG. 4.

The state in which the continuous wave signal input into the input terminal of the switching apparatus 100 is switched off is explained in detail below. The state of being switched off is a situation in which the control signal output from the control signal generator 300 has a low logical level.

If the control signal output from the control signal generator 300 has a low logical level S440, the first diode D1 and the second diode D2 are turned on S450. This is because the control signal of the low logical level is transmitted to the cathode of the first diode D1 and the cathode of the second diode D2 through the transmission line 143, so the bias is in the opposite direction.

Accordingly, the continuous wave signal input from the continuous wave generator 200 is not output externally S460. This is because the first diode D1 and the second diode D2 are switched on, so the continuous wave signal input from the continuous wave generator 200 is input to the first diode D1 and the second diode D2.

That is, the continuous wave signal input from the continuous wave generator 200 is input to the ground terminal through the continuous wave transmitter 110, the first capacitor 160, the first diode D1 and the impedance 50Ω. This is because the continuous wave signal which passes through the first capacitor 160 does not flow towards the high impedance line Z1, but flows towards the first diode D1.

Even if a part of the continuous wave leaks in the direction of the high impedance line Z1, this is input to the ground terminal through the second diode D2 and the impedance of 50Ω, so the continuous wave signal is not output on the output terminal of the switching apparatus 100. The flow of the continuous wave signal in the 'switched-off' situation is explained in FIG. 4.

Up to this point, an exemplary embodiment of a switching apparatus 100 capable of having a harmonious switching action even at high frequency signals has been explained in detail.

In the exemplary embodiment, it is assumed that a first diode D1 and a second diode D2 are connected in parallel at both ends of the high impedance line Z1. However, the number of diodes connected in parallel may also be a number other than two. That is, the number of diodes provided on the switching unit 130 may be three or more, or may be only one.

Moreover, the present invention can still be applied even if a plurality of diodes connected in series are used in place of the first diode D1, and likewise if a plurality of diodes connected in series are used in place of the second diode D2.

Also, the diodes D1, D2 provided on the switching unit 130 can be embodied as Schottky diodes, but the concept of the present invention also applies if they are embodied as other kinds of diodes.

The switching apparatus 100 can use various electrical components which require switching for high frequency signals. For example, the switching apparatus 100 can implement circuits or integrated circuits for controlling the transmission of wide band signals such as ultra wide band (UWB) circuits or integrated circuits for controlling the reception time of the continuous wave signal from a radar sensor system, multiplexers, demultiplexers, adders and the like, which must rapidly implement a digital signal disposal, or transmission/reception circuit or integrated circuit for multi-mode or multi-band signals.

As explained above, because exemplary embodiments of the present invention implement a switching action using a diode and a high impedance line instead of an FET, the switching capability is improved for low frequency signals and even for high frequency signals. Not only this, as a switching component using diodes with a simpler manufacturing process than FETs, the exemplary embodiment of switching apparatus is able to achieve simplification of the manufacturing process. Moreover, in that the diodes are smaller than FETs, the switching apparatus using the diodes has the advantage that it is smaller than a switching apparatus using conventional FETs.

The present invention is described and illustrated above making reference to the exemplary embodiments, but the present invention is not restricted to the specific exemplary embodiments described here. It will be readily apparent to those skilled in the art of the technical field to which the present invention belongs that diverse amendments and modifications are possible within the scope of the claims without deviating from the spirit of the present invention.

What is claimed is:

1. A switching apparatus, comprising:
 a bias unit, which provides a bias power source and which comprises a first blocking element which blocks an input signal from being input into the bias unit;
 a control signal transmitter, which transmits a control signal for controlling switching and which comprises a second blocking element different from the first blocking element which blocks the input signal from being input into the control signal transmitter; and
 a switching unit, which is driven by the bias power source received from the bias unit, and switches one or more diodes according to the control signal received from the control signal transmitter,
 wherein an input signal input through an input terminal is selectively output on an output terminal.

2. The switching apparatus of claim 1, wherein
 if the one or more diodes are turned off by the control signal, the input signal is output on the output terminal and if the one or more diodes are turned on by the control signal, the input signal is not output on the output terminal.

3. The switching apparatus of claim 1, wherein
 the switching unit comprises a first diode and a second diode connected in parallel, and
 if the first diode and the second diode are turned on by the control signal, part of the input signal is blocked by the first diode from flowing to the output terminal, and the remainder of the input signal is blocked by the second diode from flowing to the output terminal.

4. The switching apparatus of claim 1, wherein
 the switching unit further comprises a high impedance line disposed between the input terminal and the output terminal, connected to the anodes of one or more diodes, and having an impedance greater than a specified value.

5. The switching apparatus of claim 4, wherein the switching unit further comprises:
 a first diode wherein an anode is connected to one end of the high impedance line; and
 a second diode wherein an anode is connected to the other end of the high impedance line.

6. The switching apparatus of claim 1, wherein the one or more diodes comprise a plurality of diodes connected in series.

7. The switching apparatus of claim 1, wherein the one or more diodes comprise one or more Schottky diodes.

8. The switching apparatus of claim 1, further comprising:
 an input signal transmitter, which implements impedance matching between the component which generates the input signal and the input of the switching unit; and
 a matching unit, which implements impedance matching between the output terminal of the switching unit and the output terminal of the switching apparatus.

9. The switching apparatus of claim 8, wherein the input signal transmitter comprises a quarter wavelength transformer, and the matching unit comprises a quarter wavelength transformer.

10. The switching apparatus of claim 8, further comprising:
   a first coupling element, which stops the bias power source from being input to the input signal transmitter; and
   a second coupling element, which stops the bias power source from being input to the matching unit.

11. A switching apparatus, comprising:
   a bias unit, which provides a bias power source;
   a control signal transmitter, which transmits a control signal for controlling switching; and
   a switching unit, which is driven by the bias power source received from the bias unit, and switches one or more diodes according to the control signal received from the control signal transmitter,
   wherein an input signal input through an input terminal is selectively output on an output terminal, and
   wherein the control signal transmitter blocks the input signal input from the switching unit so that the input signal is not transmitted to a component which generates the control signal.

12. The switching apparatus of claim 11, wherein the control signal transmitter comprises a radial stub for blocking the input signal input by the switching unit.

13. A switching apparatus, comprising:
   a bias unit, which provides a bias power source;
   a control signal transmitter, which transmits a control signal for controlling switching; and
   a switching unit, which is driven by the bias power source received from the bias unit, and switches one or more diodes according to the control signal received from the control signal transmitter,
   wherein an input signal input through an input terminal is selectively output on an output terminal, and
   wherein the bias part blocks the input of the input signal from the switching unit.

14. The switching apparatus of claim 13, wherein the bias comprises a radial stub for blocking the input signal from the switching unit.

15. The switching apparatus of claim 1, wherein the input signal is a high frequency signal.

* * * * *